(12) United States Patent
Prakapenka et al.

(10) Patent No.: US 8,948,905 B2
(45) Date of Patent: Feb. 3, 2015

(54) APPARATUS AND METHOD FOR POSITIONING AN ELECTRONIC COMPONENT AND/OR A CARRIER RELATIVE TO A DISCHARGING DEVICE

(75) Inventors: Uladimir Prakapenka, Roding (DE); Rainer Miehlich, Taufkirchen (DE)

(73) Assignee: Muehlbauer GmbH & Co. KG, Roding (DE)

(*) Notice: Subject to any disclaimer, the term of this patent is extended or adjusted under 35 U.S.C. 154(b) by 0 days.

(21) Appl. No.: 14/126,400

(22) PCT Filed: Jun. 12, 2012

(86) PCT No.: PCT/EP2012/002482
§ 371 (c)(1),
(2), (4) Date: Jan. 29, 2012

(87) PCT Pub. No.: WO2012/171633
PCT Pub. Date: Dec. 20, 2012

(65) Prior Publication Data
US 2014/0142740 A1    May 22, 2014

(30) Foreign Application Priority Data
Jun. 15, 2011   (DE) .................. 10 2011 104 225

(51) Int. Cl.
| G06F 7/00 | (2006.01) |
| G05B 15/00 | (2006.01) |
| G05B 19/18 | (2006.01) |
| H01L 21/67 | (2006.01) |
| H05K 13/02 | (2006.01) |

(52) U.S. Cl.
CPC ........ H01L 21/661 (2013.01); H01L 21/67132 (2013.01); H05K 13/021 (2013.01); H05K 13/022 (2013.01)

USPC ............ 700/213; 700/228; 700/229; 700/258

(58) Field of Classification Search
None
See application file for complete search history.

(56) References Cited

U.S. PATENT DOCUMENTS

| 5,262,355 | A  | * | 11/1993 | Nishiguchi et al. ............. 29/833 |
| 6,589,809 | B1 |   | 7/2003  | Koopmans |
| 8,094,187 | B2 |   | 1/2012  | van der Sanden |
| 8,136,231 | B2 |   | 3/2012  | Schiller |
| 2011/0061227 | A1 | * | 3/2011 | Tsou et al. ....................... 29/705 |

FOREIGN PATENT DOCUMENTS

DE    19536005 A1    4/1997
(Continued)

*Primary Examiner* — Yolanda Cumbess
(74) *Attorney, Agent, or Firm* — John A. Miller; Miller IP Group, PLC

(57) ABSTRACT

An apparatus and a method for positioning electronic components to be transferred in relation to a discharging device. The discharging device includes a slide for at least one electronic component and a housing surrounding the slide. The electronic components are provided by a first carrier, which comprises a first side facing the discharging device and a second side facing away from the discharging device. An image data acquisition device captures image data of a region in which the slide is set up. A control determines positional data of the electronic component to be transferred and for generating control commands from the positional data. An actuator moves the first carrier and the discharging device in relation to each other in response to the control commands to change an offset between a longitudinal axis of the slide and a center axis of the electronic component.

14 Claims, 7 Drawing Sheets

(56) References Cited

FOREIGN PATENT DOCUMENTS

| | | |
|---|---|---|
| DE | 102006027663 A1 | 1/2008 |
| EP | 1764826 A1 | 3/2007 |
| JP | H0529439 A | 2/1993 |
| JP | 2009016455 A | 1/2009 |
| WO | 2012139766 A1 | 10/2012 |

\* cited by examiner

APPARATUS AND METHOD FOR POSITIONING AN ELECTRONIC COMPONENT AND/OR A CARRIER RELATIVE TO A DISCHARGING DEVICE

CROSS-REFERENCE TO RELATED APPLICATIONS

This application is a National Stage application of International Application No. PCT/EP2012/002482, filed Jun. 12, 2012, which claims priority to German Patent Application Serial No. DE 10 2011 104 225.7, filed Jun. 15, 2011.

BACKGROUND

Presently described are an apparatus and a method for positioning an electronic component and/or a carrier relative to a discharging device. Presently described are, in particular, an apparatus and a method where an electronic component and/or a carrier is/are positioned prior to the electronic component transfer to the carrier.

When transferring electronic components, in particular dies, and, in particular, when transferring singularized electronic components, there exists the general problem that the electronic components are subject to continuous miniaturization, which is why the precision-related requirements become continually more acute when transferring electronic components.

For example, DE 10 2006 027 663 A1 discloses an optical inspection system for measuring electronic components that allows for an inspection of the non-housing-enclosed components prior to them being taken up by an instrumentation head. JP 2009 016455 A discloses an apparatus and a method for capturing the position of a substrate. An example of a transfer device of electronic components from a first carrier to a second carrier is specified in DE 10 2011 017 218 A1.

For example, DE 103 49 847 B3 discloses a positioning apparatus and a positioning method for transferring electronic components. In this, a semiconductor wafer, which is disposed on a carrier film, is disposed above and parallel relative to a band-like substrate. The wafer can be advanced inside the wafer plane by means of a wafer holder and additionally rotated about an axis of rotation that is perpendicular relative to the wafer plane. A discharging device comprises a discharging needle, which acts on the rear of the die that must be detached, and provided is a downward motion whereby the die is detached from the carrier film. The die, which has thus been detached from the carrier film, is thereby placed in a bonding position on the band-like substrate.

The problem that exists here is the fact that the electronic components and the bonding position are hidden from above by the discharging device and the carrier film as well as from below by the substrate. The gap between the carrier film and the substrate is, moreover, in most cases very narrow, such that it is not possible to optically capture the position of the electronic components and the bonding position. Correspondingly, it is not possible to exactly align, meaning precisely position, an individual component and/or the substrate in relation to each other prior to the transfer of the component. Instead, until now, the position of the electronic components prior to the transfer has been captured outside of the device, with the position of the components presumably not changing any more after this point. If the position of a component changes due to the transfer of another component, this can result in an imprecise transfer of a plurality of electronic components onto the substrate.

Since an imprecisely placed electronic component is typically categorized as a faulty part and must therefore be discarded, optimally exact placement of the component is desirable.

An imprecisely transferred component and an imprecisely provided substrate will result in the faulty placement of a component.

Problem

Therefore, it is the object of the present invention to provide an apparatus and a method that will allow for exactly capturing the position of an electronic component and/or substrate prior to the transfer of the electronic component and allow for corrections, if necessary. In addition, the rate of throughput shall be unaffected.

Proposed Solution

A device for positioning electronic components to be transferred relative to a discharging device is proposed as a solution for achieving this object. The discharging device therein includes a slide for at least one electronic component and a housing surrounding the slide, and wherein the housing has a first translucent region. A first mirror is disposed inside the housing. A first carrier that provides the electronic components to be transferred comprises a first side facing the discharging device and a second side facing away from the discharging side, wherein a plurality of electronic components is provided on the second side. At least one image data acquisition device is set up for capturing image data of a region through the translucent region of the housing where the slide is set up for interacting with the at least one electronic component. A control is set up for determining, on basis of the captured image data, positional data of the electronic component to be transferred and for generating control commands on the basis of the positional data. At least one first actuator is set up for moving the first carrier and the discharging device in relation to each other on the basis of the control commands in order to change an offset between a longitudinal axis of the slide and a center axis of the electronic component to be transferred.

Due to the translucent region, the image data acquisition device is able to capture image data through the discharging device and is correspondingly able to capture the position of the electronic components as well that were, until now, hidden by the discharging device. It is therefore possible to capture the position of the electronic components with great precision, whereby the electronic components can be positioned with greater exactness. Moreover, since the electronic components can be positioned in the apparatus comprised of the discharging device, the first carrier and the second carrier inside which the electronic component transfer occurs, the rate of throughput is not compromised by additional travel distances.

In addition, the translucent region is able to seal the housing at least partially, whereby maintaining a negative pressure inside the housing is facilitated.

Also provided as a solution for the specified object of the invention is a method for positioning an electronic component to be transferred in relation to a discharging device. A first carrier with electronic components is provided therein in such a manner that a first side of the first carrier rests against the discharging device. A plurality of electronic components is provided on a second side of the first carrier that faces away from the discharging device. Image data are captured by means of a light path that is deflected by a first mirror, wherein the image data comprise information regarding the position of a slide of the discharging device and regarding the position of an electronic component to be transferred. Positional data of the electronic component to be transferred are determined based on the captured image data. Control commands for triggering at least one first actuator are generated on the basis of the determined positional data of the electronic component to be transferred; and the first carrier and/or the discharging device are moved in relation to each other on the basis of the generated control command in order to change the offset between a longitudinal axis of the slide and a center axis of the electronic component to be transferred.

Due to the translucent region, the image acquisition device is able to capture image data through the discharging device and can correspondingly also detect the position of the electronic components that were until now hidden by the discharging device. This way, it is possible to capture the position of the electronic components with great exactness and, therefore, also position the electronic components with more precision. Moreover, since the positioning of the electronic components can occur in the apparatus of the discharging device, the first carrier and the second carrier inside which the electronic components are transferred, the rate of throughput is not compromised by additional travel distances.

Furthermore, the translucent region of the housing is able to seal the housing at least partially, such that maintaining a negative pressure inside the housing is facilitated.

Another proposed solution for achieving the object of the present invention is a method for positioning a component to be transferred in relation to a discharging device. A first carrier with electronic components is provided therein in such a manner that a first side of the first carrier rests against the discharging device. A plurality of electronic components is provided on a second side of the first carrier facing away from the discharging device. Image data are captured, wherein the image data comprise information regarding the position of a slide of the discharging device and the position of an electronic component to be transferred. Positional data of the electronic component to be transferred are determined on the basis of the captured image data. Control commands for triggering at least one first actuator are generated on the basis of the determined positional data of the electronic component to be transferred; and the first carrier and/or the discharging device are moved in relation to each other based on the generated control command in order to change an offset between a longitudinal axis of the slide and a center axis of the electronic component to be transferred.

Also proposed is a device for positioning a second carrier having at least one contact surface for accommodating an electronic component in relation to a discharging device. Said device comprises a translucent support upon which a first side of the second carrier rests; at least one third source of radiation that is disposed at a distance in relation to the second carrier on a second side of the second carrier facing away from the translucent support; at least one optical sensor element that is set up for detecting a mark that is applied to the second carrier and for generating corresponding sensor signals; and a control that is set up for determining positional data of the contact surface on the basis of the sensor signals and for generating control commands on the basis of the positional data; and at least one second actuator that is set up for moving a first carrier, the second carrier and/or a discharging device on the basis of the control commands in order to change an offset between a longitudinal axis of the discharging device and the contact surface.

By providing for the spaced arrangement of the third source of radiation on the second side of the second carrier, it is possible to project an image of the second carrier to the optical sensor element. With the projection, it is possible to capture even minimal differences in terms of the opacity of the structures and the material of the second carrier that are represented in terms of difference in brightness. Therefore, using carrier materials of relatively great opacity is possible, such as, for example, paper or some plastics.

In addition, a method for positioning a second carrier in relation to a discharging device is proposed as well. The second carrier therein, which includes at least one contact surface for accommodating an electronic component to be transferred, is provided in such a manner that an optical sensor element is able to detect a mark that is provided on the second carrier. An image of the second carrier is projected to the optical sensor element. Sensor signals are generated, wherein the sensor signals comprise information regarding the position of the mark and the position of the discharging device. Positional data of the contact surface are determined based on the generated sensor signals. The determined positional data are used for generating control commands for triggering at least one second actuator; and the second carrier, the first carrier and/or the discharging device are moved on the basis of the generated control signals in order to change an offset between the contact surface and a longitudinal axis of a slide of the discharging device.

Finally, also proposed are an apparatus and a method for transferring an electronic component from a first carrier to a second carrier. The apparatus and/or the method therein comprise(s) the device/process for positioning an electronic component to be transferred in relation to a discharging device and/or the device/process for positioning a second carrier in relation to a discharging device.

Since the electronic components that are provided on the first carrier and on the second carrier are exactly aligned in relation to each other, the electronic components can now be transferred with greater precision than ever before. Therefore, the transfer of very small components is also possible.

Configuration and Properties of the Apparatus and the Method

In the image data, as captured by the image data acquisition device, it is possible to detect the position of the electronic components, for example, based on the saw lines that are provided between the individual electronic components.

The region that is captured by the image data acquisition device can comprise an electronic component to be transferred, meaning the component that is to be transferred next, as well as adjacent components. It is also possible therein that the electronic component to be transferred is hidden by the slide. If this is the case, the position of the component to be transferred can be determined, for example, based on the position of the surrounding/immediately adjacent components and/or based on the course of the saw lines.

Depending on the configuration of the apparatus, the electronic components to be transferred and/or the second carrier can be positioned by a movement of the discharging device, the first carrier and/or the second carrier. Correspondingly, the term "positioning" refers, in particular, to a relative movement between the discharging device and the first carrier, as well as a relative movement between the discharging device, the first carrier and the second carrier. It is not relevant as to whether, in order to achieve this relative movement, the at least one first actuator and/or the at least one second actuator moves the discharging device, the first carrier and/or the second carrier.

A first source of radiation can be provided inside the housing. The first source of radiation can be, for example, at least one LED or at least one laser diode. The wavelength that is emitted by the first source of radiation can be in the visible, ultraviolet and/or infrared range(s).

The first source of radiation can also be provided outside the housing. The first source of radiation can therein illuminate the region, that is captured by the image data acquisition device, through the first translucent region. Additionally or alternately, it is possible to provide a third translucent region through which the first source of radiation is able to illuminate the region that is captured by the image data acquisition device.

A first mirror can be disposed inside of the housing of the discharging device. An opening can be provided approximately in the center of the first mirror. A slide can be movably disposed through this opening in the direction of the longitudinal axis thereof. If the first mirror is provided, in a particularly simple configuration, it is possible to omit the first translucent region. In such an embodiment, it is possible to provide only a recess or a viewing channel in the housing, such that the inside of the housing is not delimited by a translucent region.

Moreover, a second mirror can be provided outside the housing. The second mirror can be a semi-transparent mirror that is set up for coupling in electromagnetic radiation from a second source of radiation. The second source of radiation can, for example, correspond to the first source of radiation. The second source of radiation can furthermore emit electromagnetic radiation by which the electronic component is at least partially detached from the first carrier.

The housing can have a second translucent region. An opening can be provided in the second translucent region, and through which the slide is movably disposed in the direction of the longitudinal axis thereof.

A mirror element can be disposed between the at least one optical sensor element and the translucent support, which is set up for coupling electromagnetic radiation into the light path, which is emitted by a fourth source of radiation. The mirror element can be, for example, a partially transparent or semi-transparent mirror.

The contact surface for the electronic component to be transferred and/or a conductive pattern, that is provided on the second carrier, can be used as a mark.

The third source of radiation can be set up for illuminating the second side of the first carrier and the second side of the second carrier. Correspondingly, using the third source of radiation, it is possible to project an image of the first carrier to the image data acquisition device and an image of the second carrier to the optical sensor element.

Prior to determining the positional data on the basis of the image data, the image data can be processed to adjust any perspective-related distortions of the image data. This can be advantageous, for example, when the image data acquisition device is disposed laterally and any image data are therefore captured at an angle.

SHORT DESCRIPTION OF THE DRAWINGS

Further objects, characteristics, advantages and application-related possibilities of the presently disclosed apparatus and method can be derived from the description of the embodiments and the associated accompanying drawings below, which are understood as non-limiting with regard to the scope of protection of the present invention.

DETAILED DESCRIPTION OF THE EMBODIMENTS

Figure 1:
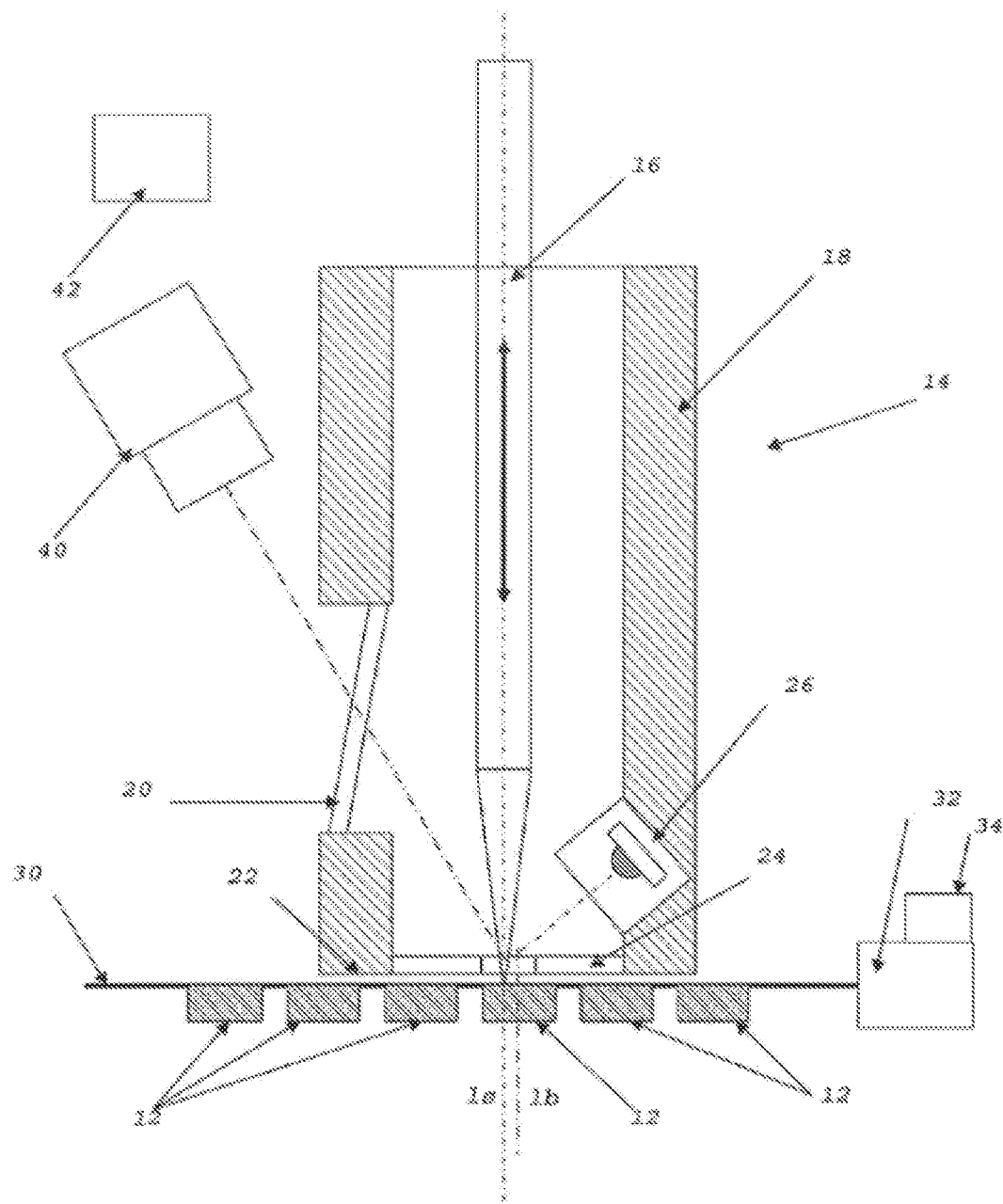
FIG. 1 is a representation of a first embodiment of a positioning device for the first carrier.

FIG. 1 depicts an embodiment of a device for positioning electronic components 12 to be transferred in relation to a discharging device 14.

The discharging device 14 includes a slide 16. One end of the slide 16 is connected to an actuator that is presently not shown, and another end of the slide 16 has a tip. The actuator of the slide 16 can be triggered therein, particularly in such a manner that the slide 16 can be moved along the longitudinal axis as shown in FIG. 1, which is indicated by the double-arrow in FIG. 1. The slide 16 can be a discharge needle, for example.

The slide 16 is surrounded by a housing 18. The housing 18 has an oblong shape and can be moved by an actuator (presently not shown). The housing 18 has a first translucent region 20 that is disposed on a longitudinal side of the housing 18. Translucent therein means that the region is permeable for a wavelength range of electromagnetic radiation. This wavelength range can be, for example, in the ultraviolet (UV) range, in the visible range to the human eye and/or in the infrared (IR) range. The first translucent region 20 can be made of glass or plastic, for example, and can be in the shape of a plate. At least one surface of the first translucent region 20 can be tilted therein toward a longitudinal axis of the housing 18, which means it is disposed at an angle to the longitudinal axis of the housing 18 that is not 0°. This way, it is possible to reduce, for example, reflections on the surface of the translucent region 20.

A support 22 is provided on one side of the housing 18, and a first carrier 30 can rest against the same. The support 22 therein is disposed substantially perpendicular relative to the longitudinal axis Is of the slide. A second translucent region 24 is provided approximately in the middle of the support 22. This second translucent region 24 can have the shape of a plate, and it can be made of the same material as the first translucent region 20. Correspondingly, the second translucent region 24 can be transparent for the same wavelength range as the first translucent region 20.

For example, the second translucent region 24 can have a diameter of approximately 3 mm and a thickness of approximately 0.3 mm. An opening is provided in the second translucent region 24, and it is possible to move the slide 16 through this opening. The diameter of the opening is therefore larger than the diameter of the slide 16. For example, the opening can have a diameter of approximately 0.3 mm.

A first source of radiation 26 is provided on the housing 18. This first source of radiation 26 can be disposed inside the housing 16, as shown in an exemplary manner in FIG. 1, or it can be disposed outside the housing 18. Alternately, it is possible to mount the first source of radiation 26 on a separate carrier element (presently now shown). This way, it is possible to move the discharging device 14 independently of the first source of radiation 26. If the first source of radiation 26 is provided outside of the housing 18, it is possible for the first source of radiation 26 to illuminate, through a first translucent region 20 or through a separate third translucent region, a region around the tip of the slide 16. The first source of radiation 26 therein is able to emit radiation of a wavelength range that corresponds approximately to the wavelength range for which the translucent regions 20, 24 are transparent.

Moreover, the first source of radiation 26 can emit rays of a wavelength range that corresponds to a wavelength range at which the material of the first carrier 30 is transparent or minimally opaque.

Due to the fact that the translucent regions 20, 24 close off openings of the housing 18, the housing 18 can be substantially air-tight, whereby it is possible to generate a negative pressure inside the housing 18. This can be desirable, for example, for transferring the electronic components and/or for detaching the electronic components from the first carrier 30.

A first side of the first carrier 30 rests against the support 22. The first carrier 30 has a second side that faces away from the support, and a plurality of electronic components 12 is provided on said side. The first carrier 30 can be a wafer film, for example. The electronic components can be singularized dies that were applied to the wafer film prior to the singularizing step. The first carrier 30 is held by a receptacle 32. At least one first actuator 34 is provided on the receptacle 32 that allows for positioning the electronic components 12 mounted on the first carrier 30. In particular, the first actuator 34 can be set up for moving the support and the first carrier 30 parallel in relation to the support 22, meaning in directions that are perpendicular relative to the longitudinal axis of the slide 16.

Moreover, FIG. 1 depicts an image data acquisition device 40. The image data acquisition device 40 is laterally disposed next to the housing 18. The image data acquisition device 40 can be mounted, for example, on a carrier element that is presently not shown, such that the discharging device 14 can be moved independently of the image data acquisition device 40. Alternately, it is also possible to mount the image data acquisition device 40 on the housing 18, such that the image data acquisition device 40 can be moved with the discharging device 14.

The image data acquisition device 40 is disposed therein in such a way in relation to the first translucent region 20, that the image data acquisition device 40 is able to capture image data of a region around the tip of the slide 16. Said region also comprises the part of the first carrier 30 that is located below the second translucent region 24. The image data acquisition device 40 can comprise an optical sensor and a lens. In the same way, it is possible to use a camera as an image data acquisition device.

The image data acquisition device 40 is able to convert electromagnetic rays of a certain wavelength range into signals. This wavelength range can be selected such that said range corresponds at least partially to the wavelength ranges at which the first source of radiation 26 emits rays and for which the translucent regions 20, 24 are transparent.

The image data acquisition device 40 is connected to a control 42 via a cable or wireless connection, such as, for example, a memory-programmed control. In addition, the control 42 is also connected to the first actuator 34. The control 42 therein is set up for determining positional data regarding an electronic component 12 to be transferred on the basis of the image data that were captured by the image data acquisition device 40. Based on the positional data of the electronic component 12 to be transferred, the control 42 can determine the offset between the longitudinal axis Is of the slide 16 and of a center axis Ib of the electronic component that extends through the center of gravity of the electronic component 12. If the determined offset exceeds a threshold value, the control 42 is able to generate control commands for triggering the first actuator 34 in order to change the offset by moving the first carrier 30. The detected offset can also be modified by moving the discharging device 14. Depending on the configuration of the device and the properties of the first carrier 30, it is possible to move the first carrier 30 and/or the discharging device 14.

Figure 2:
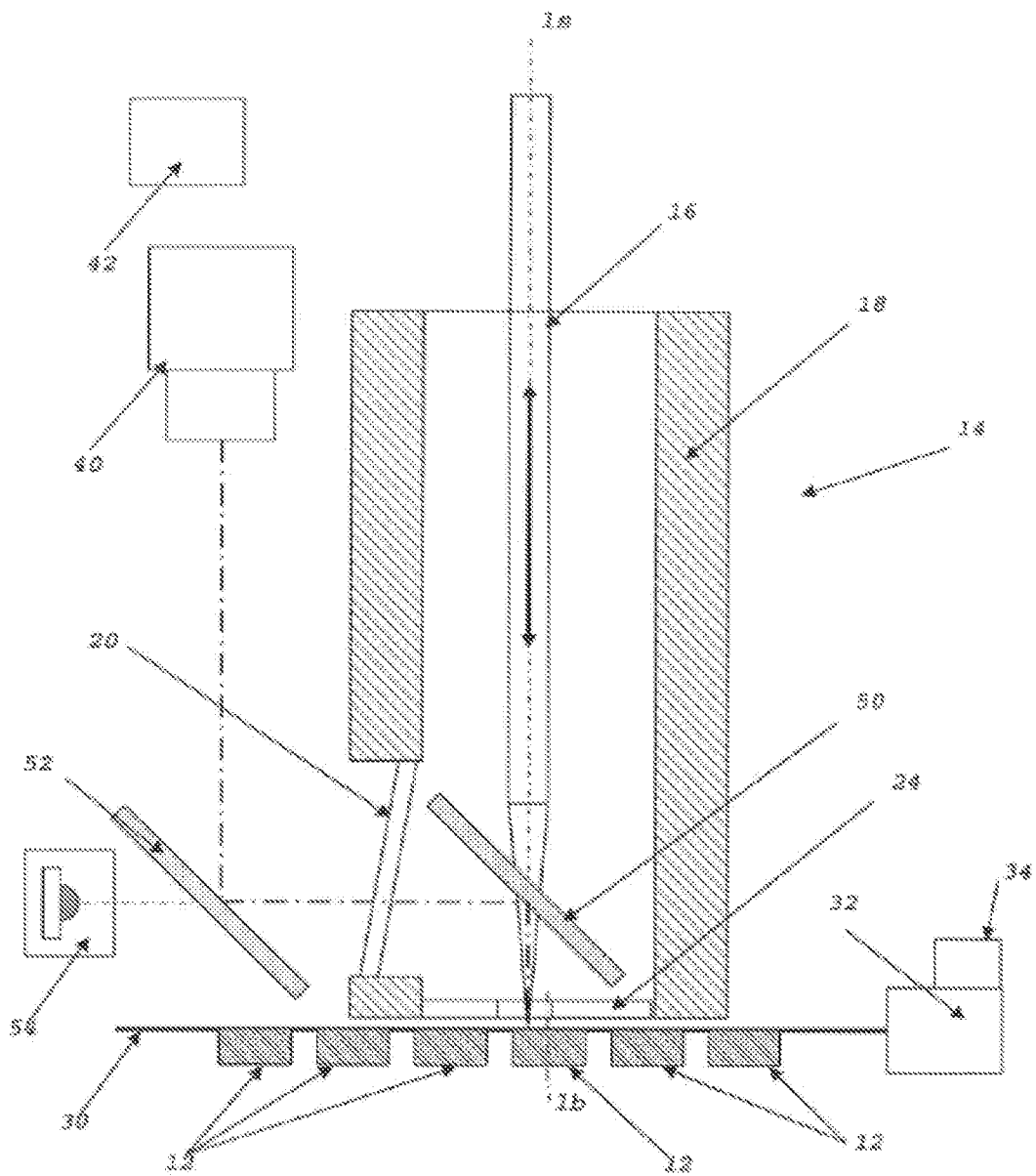
FIG. 2 is a representation of a second embodiment of a positioning device for the first carrier.

FIG. 2 depicts a second embodiment. This embodiment differs from the embodiment that was explained in connection with the representation in FIG. 1 in that the light path of the image data acquisition device 40 is not straight; instead, it is deflected by a first mirror 50.

The first mirror 50 is disposed inside the housing 18. By disposing the first mirror 50 inside the housing 18, it is possible to deflect the light path of the image data acquisition device 40 in such a manner that the light path "makes contact" in a perpendicular fashion with the region of the first carrier 30 that is disposed below the translucent region 24. Correspondingly, the image data that are captured by the image data acquisition device 40 are not distorted.

A first mirror 50 can have a size of 4×6 mm and can be disposed at an angle of 45° relative to the longitudinal axis Is of the slide 16, for example. The first mirror 50 has an opening that can be disposed approximately in the center of the first mirror 50. The slide 16 can be movably disposed along the longitudinal axis Is thereof through the opening.

A second mirror 52 is provided outside the housing 18. The second mirror 52 can be mounted on a separate carrier element. Correspondingly, the discharging device 14 can be moved independently of the second mirror 52. The carrier element therein can correspond to the carrier element to which the image data acquisition device 40 is mounted. Alternately, the second mirror 52 can also be mounted on the housing 18.

The second mirror 52 can be a semi-transparent mirror. This way, it is possible to couple the radiation that is emitted by a second source of radiation 54 into the light path that is indicated by the optical axis. Correspondingly, no separate translucent region is necessary for the second source of radiation 54.

The second source of radiation 54 can be additionally set up for emitting electromagnetic radiation that is suitable to at least partially dissolve an adhesive connection between the first carriers 30 and the electronic components that are provided on the first carrier 30. By coupling in the electromagnetic radiation, it is thereby possible to irradiate the region of the first carrier 30 that is located immediately below the second translucent region 24 in a targeted fashion. For example, it is possible to use UV or IR radiation to partially dissolve an adhesive connection.

The image data acquisition device 40 is disposed next to the discharging device 14. The light path between the second mirror 52 and the image data acquisition device 40 is therein substantially parallel relative to the longitudinal axis of the slide 16. Alternately to the embodiment as depicted in FIG. 2, the image data acquisition device 40 can also be disposed in the position of the second mirror 52. In that case, accordingly, the image data acquisition device 40 is not vertically disposed, as depicted in FIG. 2; instead, it is horizontally disposed.

With the shown arrangement of the translucent regions 20, 24 and the image data acquisition device 40, it is thus possible to capture image data from a region of the first carrier 30 that would be hidden on known apparatuses by the discharging device 14. Correspondingly, the depicted arrangement allows for positioning the electronic components 12 at a time when the first carrier already rests against the support 22, or when it is directly below the support.

Figure 3:
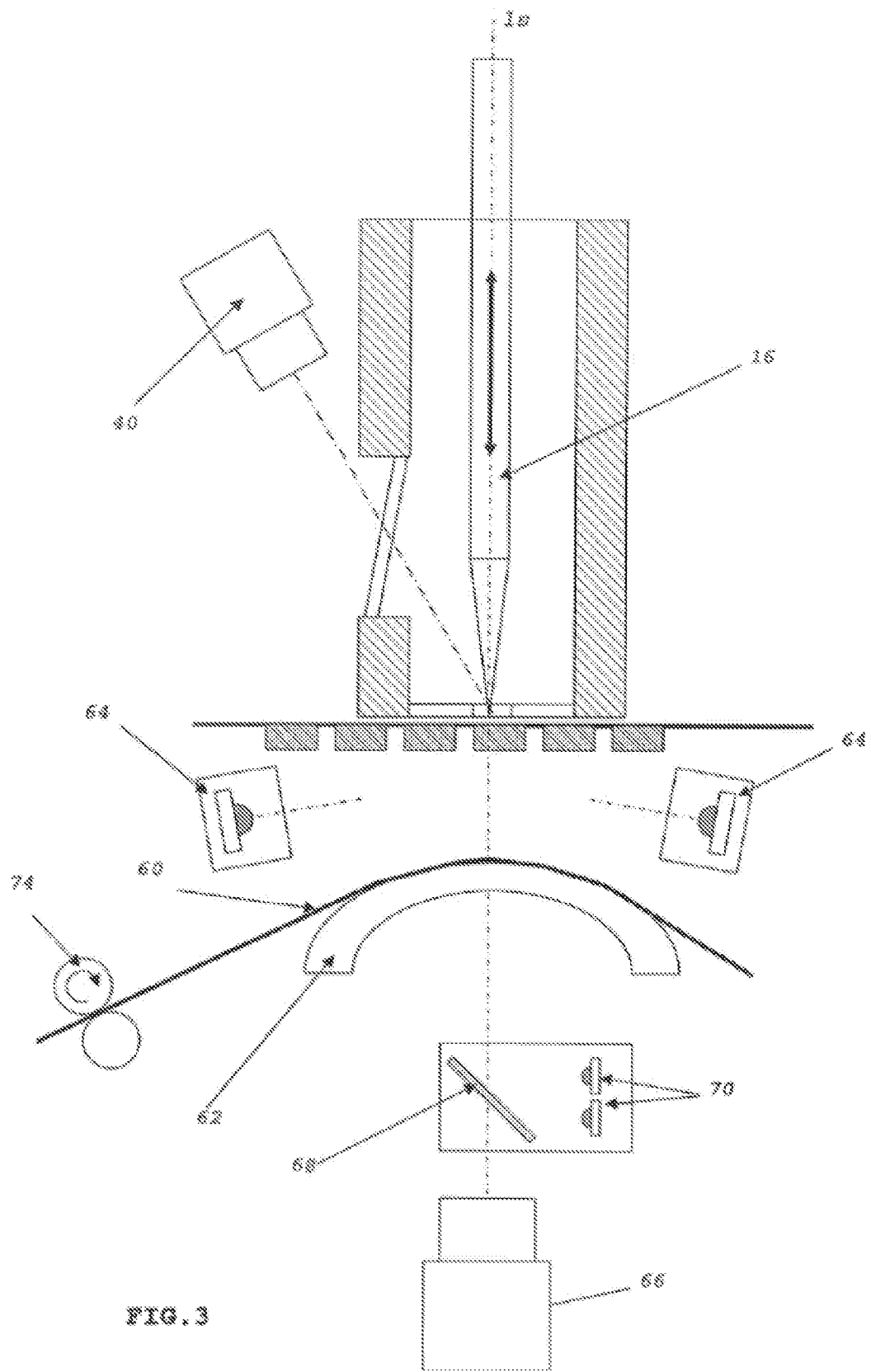
FIG. 3 is a representation of a first embodiment of a positioning device for the first carrier and a positioning device for the second carrier.

FIG. 3 depicts a device for transferring electronic components from a first carrier to a second carrier. Aside from the device that was described previously in FIG. 1, this device comprises also an apparatus for positioning the second carrier in relation to the discharging device.

A second carrier 60 is provided at a distance in relation to the first carrier 30. The second carrier 60 can be, for example, a substrate band that is used as carrier material in the manufacture of chip cards or smart cards. The second carrier 60 has a contact surface upon which an electronic component 12 to be transferred must be placed. The contact surface therein can include electrical contact points; however, but just the same, it can also be an electrically non-conducting structure. Further structural patterns can be provided on the second carrier 60, aside from the contact surface, such as, for example, conductor paths. The conductor paths or contact surfaces can be used as marks therein. However, it is also possible to provide separate marks.

The second carrier 60 rests by one side thereof on a translucent support 62. The translucent support 62 can be formed of the same material as the translucent regions 20, 24; and they can be transparent, correspondingly, for a comparable wavelength range. The translucent support 62 is curved in the depicted embodiment. The curvature is selected accordingly so that the second carrier 60 rests evenly against the translucent support 62. Alternately to a curved support, it is also possible to use a flat support with or without rounded edges.

A third source of radiation 64 is provided between the second side of the first carrier 30 and the second side of the second carrier 60. The third source of radiation 64 can substantially correspond to the first and the second sources of radiation 26, 54. The third source of radiation 64 is set up for illuminating the gap between the first carrier 30 and the second carrier 60.

The wavelength range that is emitted by the third source of radiation 64 can be matched to the material of the second carrier 60 and the translucent support 62. Thus, the third source of radiation 64 can emit radiation of a wavelength range in which the material of the second carrier 60 and/or of the translucent support 62 is transparent or only minimally opaque. For example, this way, it is possible for the third source of radiation 64 to emit radiation of a wavelength range at which paper demonstrates particularly small opacity.

Disposed at a distance relative to the translucent support 62 is an optical sensor element 66. The optical sensor element 66 is disposed on the side of the translucent carrier 62 that is opposite the side of the discharging device 14. The optical sensor element 66 is set up therein in such a manner so as to capture a mark that is provided on the second carrier 60, and outputting the corresponding control signals. As indicated previously, this mark can be a contact surface or a conductor path, which is provided on the second carrier 60. In the same manner, it is possible to provide a separate mark, for example, in form of a recess of the second carrier 60.

The optical sensor element 66 can correspond, for example, to the previously described image data acquisition devices 40. However, in an especially simple embodiment, the optical sensor element can also be a phototransistor or a photodiode. The phototransistor or the photodiode therein can form a forked photoelectric barrier with the third source of radiation 64 by which the recess in the second carrier 60 can be captured. Alternately relative to a thus implemented forked photoelectric barrier, it is also possible to use a conventional forked photoelectric barrier for capturing the mark.

By this arrangement of the third source of radiation 64, the second carrier 60, the translucent support 62 and the optical sensor element 66, it is possible to project the structural pattern of the second carrier to the optical sensor element 66, meaning the optical sensor element 66 is able to capture the "shadow" of the second carrier 60.

Due to the fact that the marks that are provided on the second carrier generally have a greater opacity than the material of the second carrier 60, it is possible to recognize, in the projection, the structural patterns that are provided on the second carrier 60 very nicely based on the differences in brightness, which can thus be used for positioning the second carrier in relation to the discharging device 14.

A partially transparent mirror 68 is provided between the translucent support 62 and the optical sensor element 66 that is set up for reflecting the radiation of a fourth source of radiation 70 to the translucent support. Moreover, the partially transparent mirror 68 is set up such that radiation from the translucent support 62 is allowed to pass through to the optical sensor element 66. Depending on the configuration of the partially transparent mirror 68, the arrangement of the fourth source of radiation 70 and the optical sensor element 66 can vary. For example, the positions of the optical sensor element 66 and the fourth source of radiation can be reversed.

The optical sensor element 66 is connected to the control 42. The control 42 therein is set up for determining positional data of the second carrier 60 from the sensor signals of the optical sensor element 66. For example, the control 42 is able to determine the position of a mark. Based on the determined positional data, the control is able to detect as to whether there is an offset between the longitudinal axis of the slide Is and the contact surface for the electronic component 12a to be transferred and to generate, if necessary, a control command for triggering at least one second actuator 74 in order to change the offset. The second actor 74 therein is set up for moving the second carrier 60 in relation to the discharging device 14 and/or the first carrier 30 in order to thereby achieve a correction of the detected offset. For example, the at least one second actuator can be a drive means that winds or unwinds, respectively, the substrate band.

The electromagnetic radiation that is emitted by the third source of radiation 64 can also illuminate the part of the first carrier that is captured by the image data acquisition device 40. The third source of radiation 64 therein is able to project the electronic components 12 and saw lines between the electronic components to the image data acquisition device 40. In this case, it is possible to omit the first and/or the second source(s) of radiation 26, 54.

Figure 4:
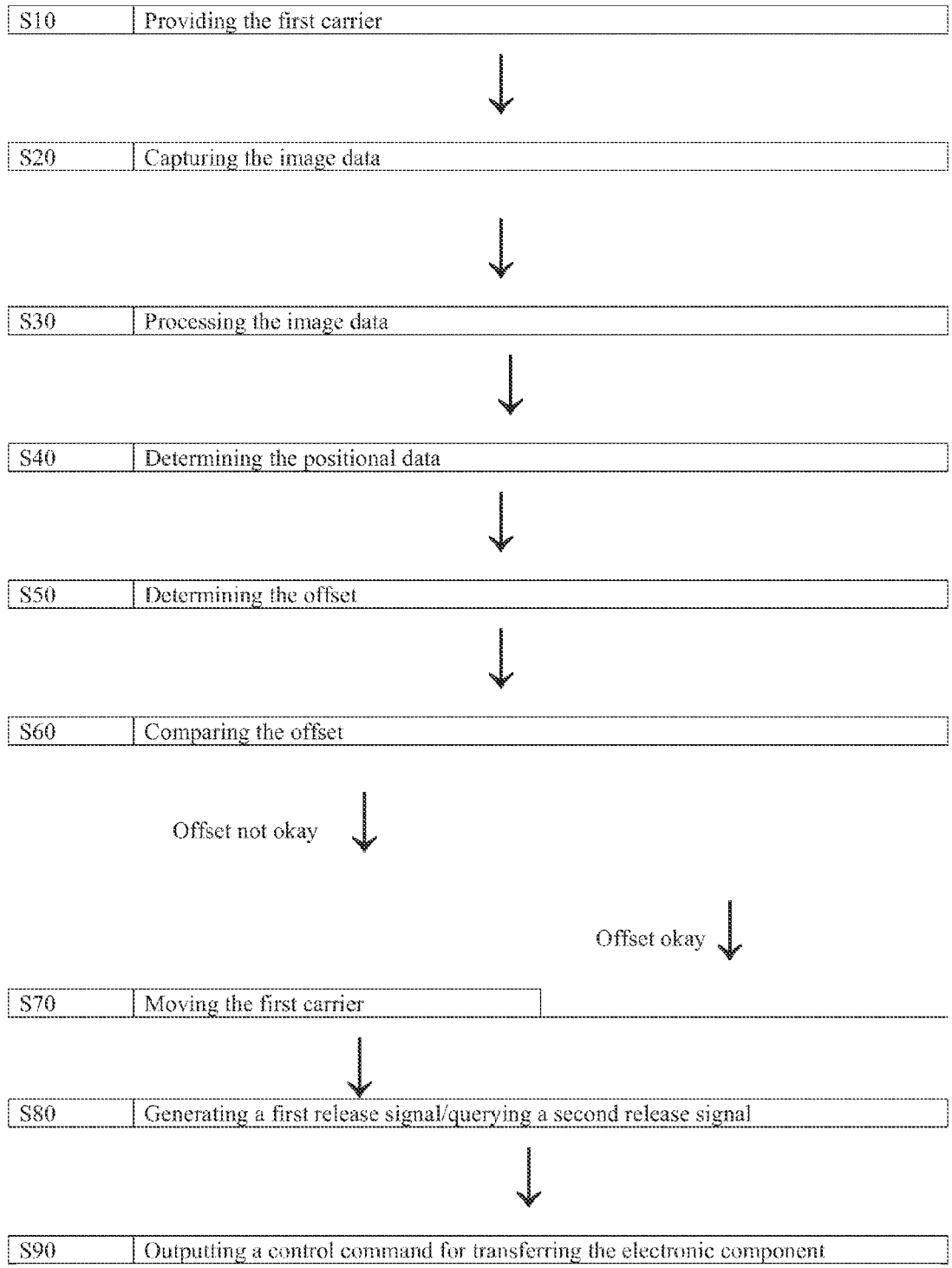
FIG. 4 is a representation of a flow diagram of a process for positioning a first carrier.

FIG. 4 depicts a flow diagram of a method for positioning the first carrier 30. Step S10 makes the first carrier 30 available. To this end, the first carrier 30 is disposed below the discharging device 14, such that the first carrier 30 rests against the discharging device 14 or is disposed at a very small distance in relation to the discharging device 14. In this position of the first carrier 30, a conventional discharging device 14 will hide the electronic component 12a to be transferred.

In step S20, the image data acquisition device 40 captures image data of the first carrier 30. The image data therein contain at least information regarding the position of the slide 16 as well as regarding the position of the electronic component 12a to be transferred. Due to the fact that the electronic components 12, 12a are provided on the second side of the first carrier 30 that faces away from the discharging device 14 and thereby also the image data acquisition device 40, the first carrier 30 should have a certain transparency, such that the saw lines between the electronic components 12, 12a can be determined on the basis of differences in brightness of the image data.

In step S30, image data are processed to modify any distortions in terms of perspective of the image data. Such distortions occur, for example, when the image data acquisition device 40 is laterally disposed, as shown in FIG. 1, wherefore the image data are captured "at an angle", meaning that the light path of the image data acquisition device and the first carrier 30 are disposed at an angle of ≠90°. If the light path of the image data acquisition device 40 and the first carrier 30 is at an angle of ≠90°, such as, for example, in the subject-matter as represented in FIG. 2, such processing is not necessary.

In step S40, positional data of the electronic component to be transferred are determined on the basis of the captured image data. It is possible to use the saw lines, for example, for determining the positional data. If the first carrier has a certain transparency, typically, the saw lines can be easily detected in the captured image data. Correspondingly, it is possible to determine the positional data of the electronic component on the basis of the saw lines surrounding said electronic component.

Even if the captured image data do not represent the slide 16, the control 42 is still able to capture the position of the electronic components 12, 12a, provided the image acquisition device 40 captures the image data always in the same position, meaning the arrangement of the image data acquisition device 40 remains constant in relation to the discharging device 14 and the first carrier 30.

In step S50, based on the positional data, an offset is determined between the longitudinal axis Is of the slide and the center axis of the electronic component to be transferred.

In step S60, if no offset is detected, or if the offset is within a tolerance range, a control command is generated, and output in step S90, ordering the transfer of the electronic component 12a. If the offset exceeds a threshold value, control commands are generated and output to the at least one first actuator 34.

In step S70, the at least one first actuator 34 moves the first carrier 30 and/or the discharging device 14 to change the detected offset.

In step S80, for example, a query is possible as to whether the second carrier 60 is already positioned correctly, meaning that the process, as described below in connection with FIG. 5, was already executed correctly. This can be detected, for example, on the basis of a second release signal that is generated in step S180. Correspondingly, a first release signal can be generated in step S80 that is subsequently taken into consideration in the process for positioning the second carrier 60.

After completing steps S70 and S80, a control signal can be generated, and output in step S90, ordering the transfer of the electronic component 12a. Alternately, it is possible to restart the process in order to check as to whether the modified position of the electronic component 12a is indeed the correct position.

Figure 5:
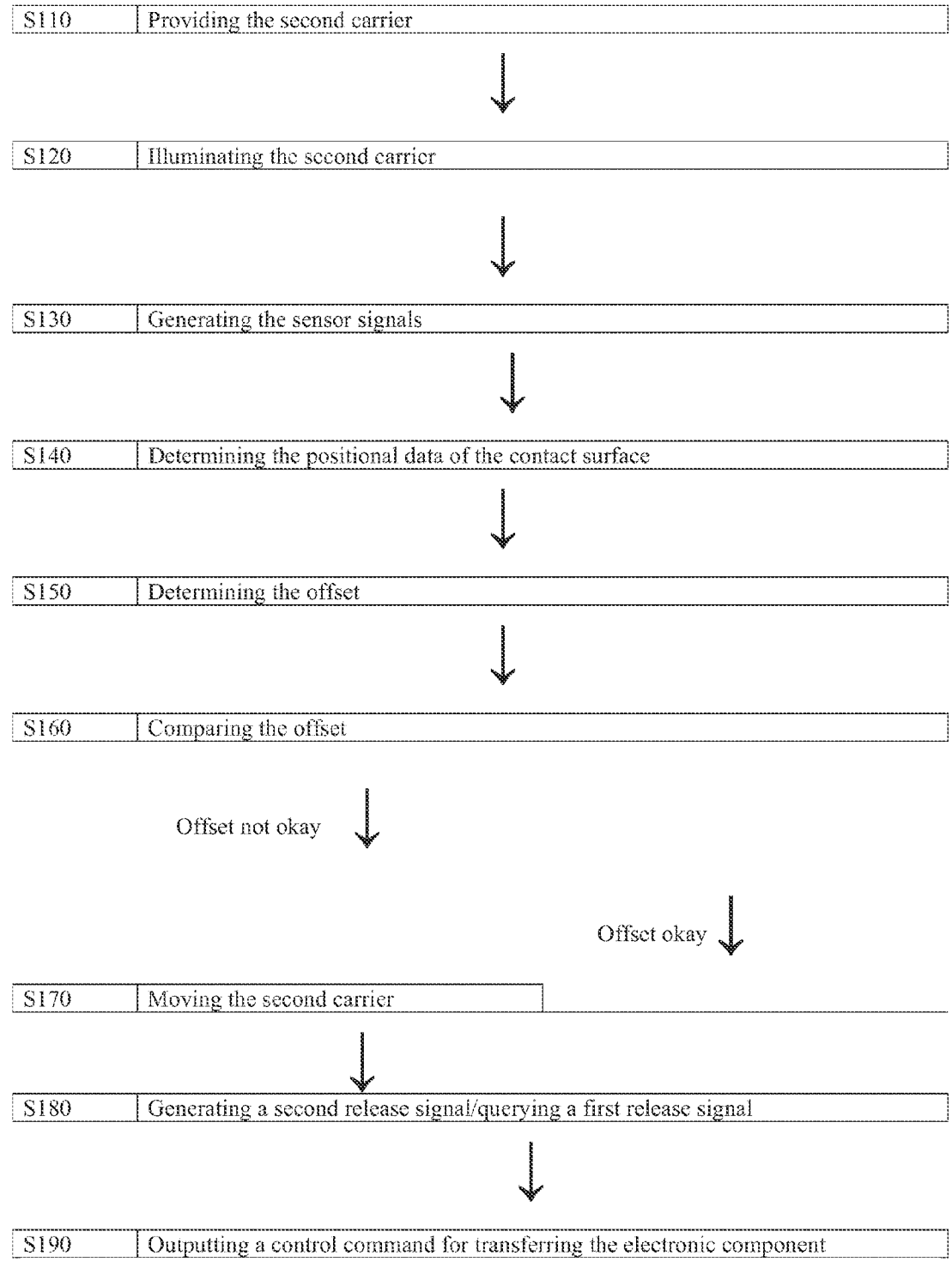
FIG. 5 is a representation of a flow diagram of a process for positioning a second carrier.

FIG. 5 depicts a flow diagram of a process for positioning the second carrier. The carrier 60 is made available in step S110. This can be achieved, for example, by unwinding a substrate band. The second carrier 60 has a mark that can be detected by the optical sensor element 66.

In step S120, the third source of radiation 64 illuminates the second side of the second carrier 60. This way, it is possible to project an image of the second carrier 60 to the optical sensor element 66. The third source of radiation 64 therein can emit electromagnetic radiation at least for as long until the optical sensor element 66 outputs corresponding sensor signals, meaning until step S130 is complete.

In step S130, the optical sensor element 66 outputs sensor signals on the basis of the projected image of the second carrier 60.

In step S140, the control 42 determines on the basis of the sensor signals the positional data of the contact surface that is provided on the second carrier 60.

In step S150, an offset between the contact surface and the longitudinal axis of the slide is determined on the basis of the positional data.

In step S160, it is determined if the offset exceeds a threshold value. Said threshold value can be defined, for example, prior to executing the process. If the offset is smaller than the threshold value, a control command ordering the transfer of the electronic component 12a can be output immediately (step S190). If the offset is greater than the determined threshold value, a control command is generated and output for actuating the at least one second actuator 74.

In step S170, the at least one second actuator 74 moves the second carrier 60, the first carrier 30 and/or the discharging device 14 in order to change the offset.

In step S180, it can be queried, for example, as to whether the first carrier 30 and the discharging device 14 have previously been positioned correctly, meaning if the process that was described earlier in connection with FIG. 4 was already executed correctly. This can be detected, for example on the basis of a first release signal that is generated in step S80. Correspondingly, it is possible to generate a second release signal in step S180 that is taken into account for the process of positioning the first carrier 30.

In step S190, it is then possible to generate and output a control command ordering the transfer of the electronic component 12a. The process can alternately be restarted to determine if the contact surface for accommodating the electronic component is in fact positioned correctly.

Figure 6A:
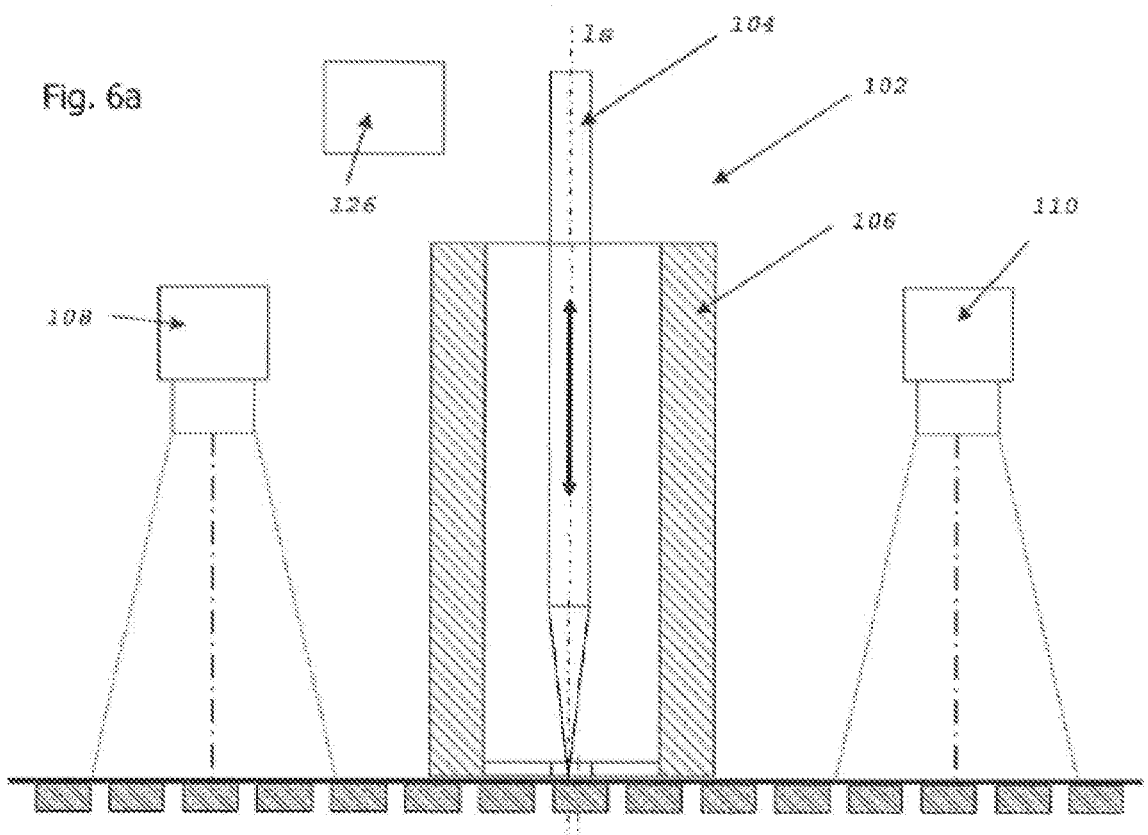
FIGS. 6a and 6b are a representation of a third embodiment of a positioning device for the first carrier.

A further embodiment is depicted in FIG. 6a. A discharging device 102 includes a slide 104 and a housing 106 that surrounds the slide 104. In essence, the discharging device 102 can correspond to the discharging device 14 that was illustrated in the context of FIG. 1; however, the embodiment as specified in FIG. 6a does not require a first translucent region 20. The embodiment as shown in FIG. 6a includes at least two indirect image data acquisition devices 108, 110. The term "indirect" indicates therein that the captured image data are not image data of the electronic component to be transferred, meaning of the component that is located directly below the slide, but that these are image data of adjacent electronic components. The term adjacent therein is not limited to directly adjacently disposed electronic components; also included are electronic components that are disposed at a distance thereto. The indirect image data acquisition devices 108, 110 can correspond to the image data acquisition device 40 that was described in connection with FIG. 1.

The indirect image data acquisition devices 108, 110 are disposed at a distance in relation to the discharging device 102. The optical axes of the indirect image data acquisition devices 108, 110 are substantially parallel in relation to the longitudinal axis of the side 106.

Figure 6B:
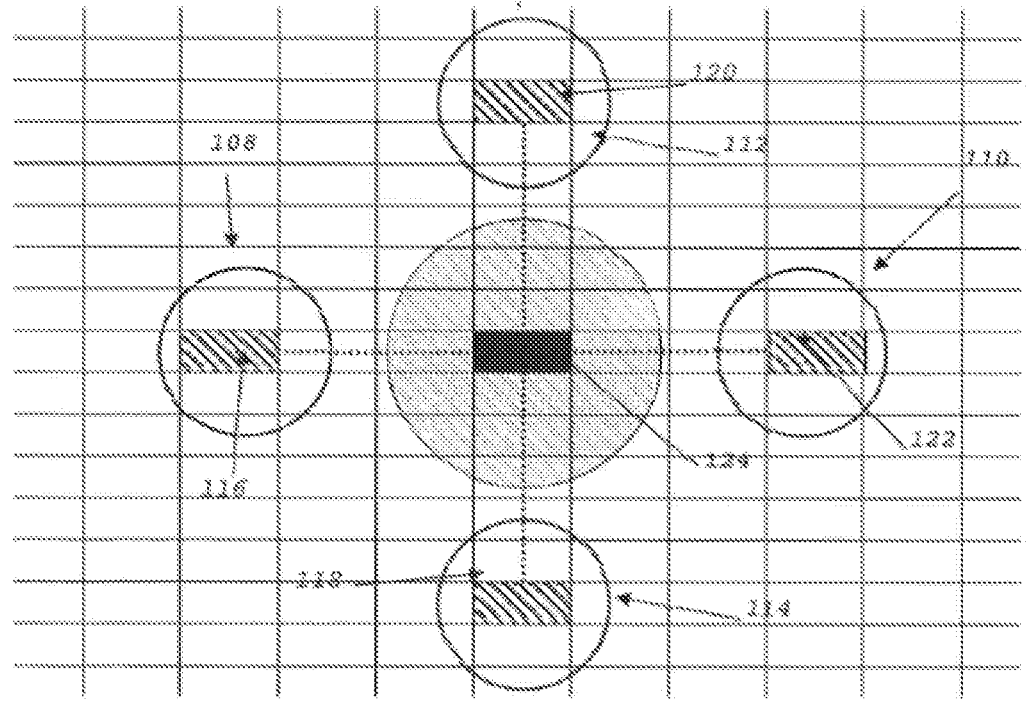

FIG. 6b is a representation of a top view of the subject-matter as shown in FIG. 6a. The hatched area in the circle therein points to the region of the first carrier 30 that is hidden by the discharging device 102; the grid points to the saw lines of the wafer. Unlike the subject-matter as shown in FIG. 6a, the subject-matter that is depicted in FIG. 6b includes four indirect image data acquisition devices 108, 110, 112, 114. The indirect image data acquisition devices 108, 110, 112, 114 capture image data of electronic components that are disposed below the indirect image data acquisition devices 108, 110, 112, 114. The image data regarding the electronic components 116, 118, 120, 122 are captured accordingly. As shown in FIG. 6b, the electronic components 116, 118, 120, 122 are disposed at a distance in relation to the electronic component 124 to be transferred.

The image data that are captured by the indirect image data acquisition devices 108, 110, 112, 114 are transferred to a control 126 as represented in FIG. 6a. The control 126 is set up for determining positional data of the electronic components 116, 118, 120, 122 disposed at a distance. The control 126 is moreover set up for accessing saved apparatus data, wherein the apparatus data contain information regarding the arrangement of the electronic components on the first carrier. Apparatus data can be made available, for example, by a manufacturer of electronic components and stored in a memory (not shown). Alternately, it is possible to capture the arrangement of the electronic components on the first carrier in advance.

The control 126 is able to determine positioning data of the electronic component 124 to be transferred on the basis of the determined positioning data and apparatus data. Due to the positioning data of the electronic component 124 to be transferred, the control 126 is able to determine if the position of the electronic component 124 to be transferred has an offset in relation to the longitudinal axis Is of the slide. Correspondingly, the control 126 is then able to generate a control command for triggering the at least one first actuator in order to thus change the offset, consequent to the then resulting movement of the first carrier 30 and/or the discharging device.

Figure 7:
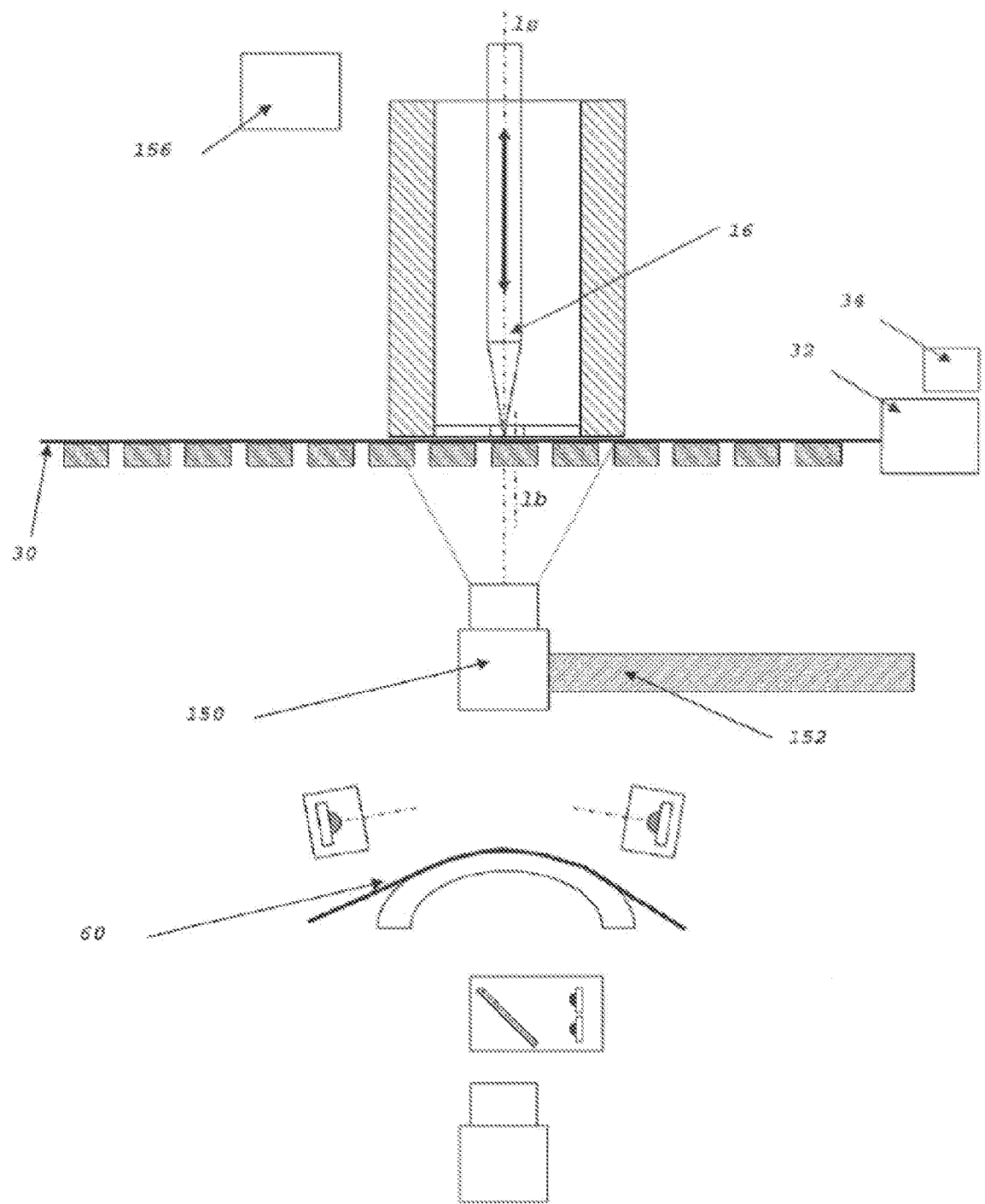
FIG. 7 is a representation of a fourth embodiment of a positioning device for the first carrier.

FIG. 7 is a representation of a further embodiment. In this embodiment, a movable image acquisition device 150 is provided, additionally or alternatively to the previously described image data acquisition devices 40 and the indirect image data acquisition devices 108, 110, 112, 114. The movable image data acquisition device 150 therein is mounted, for example, on a pivot arm 152 that allows for moving the movable image data acquisition device 150, as depicted in FIG. 7, between the first position and a second position (not shown).

The first position therein is located between the first carrier 30 and the second carrier 60 to which the electronic components 12 must be transferred. The movable image data acquisition device 150 is correspondingly able to capture image data of the second side of the first carrier 30. For example, the first position can be selected in such a manner that the optical axis of the movable image data acquisition device 150 matches the longitudinal axis Is of the slide. The movable image data acquisition device 150 can transfer the captured image data to a control 156. On the basis of the captured image data, the control 156 is then able to determine the positioning data for an electronic component to be transferred. On the basis of the positional data and comparable to the previously described embodiments, the control 156 is able to determine as to whether an offset is present between the longitudinal axis Is of the slide 16 and the center axis Ib of the electronic component 12. If this offset exceeds a threshold value, a control signal is generated by which the at least one first actuator 34 is triggered in order to change the offset.

The movable image data acquisition device 150 makes it possible to capture image data of the electronic component 12 free of distortions. Due to the fact, however, that the movable image data acquisition device 150 is disposed between the first carrier 30 and the second carrier 60, the movable image data acquisition device 150 must be moved to the second position prior to being able to transfer electronic components. Moreover, enlarging the distance between the first carrier 30 and the second carrier 60 can be necessary. To this end, it is possible to provide for a movement of the first carrier 30, the discharging device 14 and/or the second carrier 60.

If the arrangement of the electronic components on the first carrier is known, meaning the apparatus of the electronic components on the first carrier 30 was captured previously, or it was made available by the manufacturer of the electronic components, and present in the form or apparatus data, it is possible to capture the positional data of the electronic components 12 by way of taking a sampling in order to thereby accelerate the transfer of the electronic components. For example, after a certain number of electronic components was transferred from the first carrier to the second carrier, the movable image data acquisition device 150 can be moved to the first position for determining the positional data of an electronic component. On the basis of the determined positional data, it is then possible to correct any offset that may be present. In addition, it is possible to extrapolate the position of the adjacent electronic components on the basis of the stored apparatus data. As such, it is possible, for example, to capture for each column and/or row of electronic components only the positional data for one electronic component, respectively. For example, this can be the electronic component that is to be transferred first from a column or row. The positions of the remaining electronic components of the column or row are then determined by extrapolation from the first result. It can be seen that a sampling-like inspection can also be provided in connection with the processes as depicted in FIGS. 4 and 5 as well.

In the same manner, the movable image data acquisition device 150 can be used to detect the position of one or multiple reference components. The one or multiple reference components can be, for example, reference dies of the wafer map, meaning components the positions of which can serve as reference points for the apparatus data.

The movable image data acquisition device 150 as depicted in FIG. 7 can also be used, for example, for capturing apparatus data of the electronic components that are provided on the first carrier.

Although the previously illustrated details involving the method and device have been placed in a context, it is presently emphasized that the same can also stand alone and independently, and they can be freely combined with one another, at least insofar as set forth in single claims that specifically address the same. Moreover, any further characterizing features that were disclosed in a context can also stand alone or can be freely combined with other characteristics. The proportional scales and dimensions as shown in the figures have been chosen to best clarify essential properties and characteristics of the apparatus/method; in a real implementation, different scales and dimensions can be chosen.

The invention claimed is:

1. An apparatus for positioning electronic components, having:
   a discharging device that includes a slide for at least one of the electronic components and a housing surrounding the slide, wherein the housing has an oblong shape and includes a first translucent region on the longitudinal side thereof;
   a first carrier that provides the electronic components to be transferred comprising a first side facing the discharging device and a second side facing away from the discharging device, wherein a plurality of the electronic components are provided on the second side;
   at least one image data acquisition device that is disposed laterally next to the housing and that is set up for capturing image data of a region through the first translucent region of the housing in which the slide is set up for interacting with at least one of the electronic components;

a control that is set up for determining positional data of the electronic component to be transferred from the captured image data and for generating control commands on the basis of the positional data, and at least one actuator that is set up for moving the first carrier and the discharging device on the basis of the control commands in relation to each other in order to change an offset between the longitudinal axis of the slide and a center axis of the electronic component to be transferred, a second carrier with at least one contact surface for accommodating the electronic component to be transferred; and an optical sensor element that is set up for capturing a mark that is provided on the second carrier and for generating sensor signals, wherein the sensor signals comprise information regarding the position of the mark and the position of the discharging device;

wherein the control is set up for determining positional data of the contact surface on the basis of the generated sensor signals and for generating control signals to trigger at least one second actuator on the basis of the determined positional data of the contact surface in order to position the second carrier in relation to the first carrier and the discharging device on the basis of the generated control signals in directions perpendicular in relation to the longitudinal axis of the slide in order to change an offset between the contact surface and the longitudinal axis of the slide of the discharging device.

2. The apparatus according to claim 1, wherein the discharging device comprises a first mirror that is disposed inside the housing.

3. The apparatus according to claim 1, wherein a first source of radiation is provided inside the housing or outside the housing.

4. The apparatus according to claim 2, wherein the first mirror includes an opening, and the slide movably disposed through the opening in the direction of the longitudinal axis.

5. The apparatus according to claim 2, wherein a second mirror is provided outside the housing.

6. The apparatus according to claim 5, wherein the second mirror is a semi-transparent mirror that reflects electromagnetic radiation from a source of radiation.

7. The apparatus according to claim 6, wherein the source of radiation is set up for emitting electromagnetic radiation that is suitable for detaching the electronic component at least partially from the first carrier.

8. The apparatus according to claim 1, wherein the housing includes a second translucent region, and wherein the second translucent region has an opening through which the slide is movably disposed in the direction of the longitudinal axis.

9. The apparatus according to claim 1 wherein the second carrier has a contact surface for accommodating an electronic component in relation to the discharging device, said apparatus further comprising:

a translucent support upon which a first side of the second carrier rests;

at least one source of radiation that is disposed at a distance relative to the second carrier on a second side of the second carrier facing away from the translucent support;

at least one optical sensor element that detects a mark that is applied to the second carrier and for generating corresponding sensor signals;

said control determining positional data of the contact surface from the sensor signals and for generating control commands on the basis of the positional data; and at least one second actuator that is set up for moving the first carrier, the discharging device and/or the second carrier on the basis of control commands in order to change an offset between a longitudinal axis of the discharging device and the contact surface.

10. The apparatus according to claim 9, wherein a mirror element is disposed between the at least one optical sensor element and the translucent support that is set up for coupling electromagnetic radiation, which is emitted by another source of radiation, in the light path between the optical sensor element and the translucent support.

11. The apparatus according to claim 9, wherein the mark is the contact surface for the electronic component to be transferred and/or a conductive pattern provided on the second carrier.

12. The apparatus according to claim 11, wherein the source of radiation is set up for illuminating the second side of the first carrier (30) and the second side of the second carrier.

13. A method for positioning an electronic component to be transferred in relation to a discharging device by means of a slide that is disposed inside a housing, wherein the housing has an oblong shape and has a first translucent region on a longitudinal side thereof, including the steps of:

providing a first carrier with electronic components such that a first side of the first carrier rests against the discharging device, and wherein a plurality of the electronic components are provided on a second side of the first carrier facing away from the discharging device;

capturing image data by means of an image data acquisition device, which is disposed laterally next to the housing, and through the first translucent region, wherein the image data comprise information regarding the position of the slide of the discharging device and the position of an electronic component to be transferred;

determining positional data of the electronic component to be transferred on the basis of the captured image data;

generating a control command for triggering a first actuator on the basis of the captured positional data of the electronic component to be transferred;

providing a second carrier with at least one contact surface for accommodating an electronic component to be transferred, such that an optical sensor element is able to detect a mark that is provided on the second carrier;

projecting an image of the second carrier to the optical sensor element;

generating sensor signals, wherein the sensor signals comprise information regarding the position of the mark and the position of the discharging device;

determining the positional data of the contact surface on the basis of the generated sensor signals;

generating control commands for triggering a second actuator on the basis of the determined positional data of the contact surface; and positioning the second carrier, the first carrier and the discharging device on the basis of the generated control commands in directions perpendicular in relation to the longitudinal axis of the slide in order to change an offset between the contact surface and the longitudinal axis of the slide of the discharging device.

14. The method according to claim 13, wherein a negative pressure is generated inside the housing when transferring the electronic components and/or detaching the electronic components from the first carrier.

* * * * *